(12) United States Patent
Wheeler

(10) Patent No.: US 6,901,545 B2
(45) Date of Patent: May 31, 2005

(54) TESTING METHOD FOR PERMANENT ELECTRICAL REMOVAL OF AN INTEGRATED CIRCUIT OUTPUT AFTER PACKAGING

(75) Inventor: Alan R. Wheeler, Boise, ID (US)

(73) Assignee: Micron Technlology, Inc., Boise, ID (US)

( * ) Notice: Subject to any disclaimer, the term of this patent is extended or adjusted under 35 U.S.C. 154(b) by 43 days.

(21) Appl. No.: 10/364,993

(22) Filed: Feb. 11, 2003

(65) Prior Publication Data

US 2003/0145262 A1 Jul. 31, 2003

Related U.S. Application Data

(62) Division of application No. 09/525,180, filed on Mar. 14, 2000, now abandoned.

(51) Int. Cl.[7] ............................................... G06F 11/00
(52) U.S. Cl. ..................................... 714/736; 365/225.7
(58) Field of Search ................................ 714/736, 718; 365/225.7, 200, 185.05

(56) References Cited

U.S. PATENT DOCUMENTS

| | | | |
|---|---|---|---|
| 4,605,872 A | * | 8/1986 | Rung .......................... 307/465 |
| 5,111,073 A | | 5/1992 | Suzuki et al. |
| 5,247,522 A | * | 9/1993 | Reiff ............................ 714/43 |
| 5,424,986 A | * | 6/1995 | McClure ..................... 365/200 |
| 5,455,798 A | * | 10/1995 | McClure ..................... 365/200 |
| 5,532,966 A | | 7/1996 | Poteet et al. |
| 5,612,918 A | * | 3/1997 | McClure ..................... 365/200 |
| 5,926,156 A | | 7/1999 | Katoh et al. |
| 6,141,245 A | | 10/2000 | Bertin et al. |
| 6,346,846 B1 | * | 2/2002 | Bertin et al. ................. 327/525 |
| 6,557,106 B1 | * | 4/2003 | Yuzawa et al. ............. 713/300 |
| 6,621,260 B2 | * | 9/2003 | Eldridge et al. ......... 324/158.1 |

* cited by examiner

*Primary Examiner*—Phung My Chung
(74) *Attorney, Agent, or Firm*—TraskBritt

(57) ABSTRACT

An apparatus and method of disconnecting or disabling an input/output terminal of an integrated circuit after packaging. Each input/output terminal of the integrated circuit includes a disabling device coupled thereto between the input/output terminal and the output driver of the respective input/output terminal. A DRAM module is disclosed having a plurality of partially good DRAM devices wherein the known bad input/output terminals are permanently disconnected using a disabling device, both the known good and known bad input/output terminals being coupled to conductive traces of a carrier substrate.

6 Claims, 7 Drawing Sheets

TESTING METHOD FOR PERMANENT ELECTRICAL REMOVAL OF AN INTEGRATED CIRCUIT OUTPUT AFTER PACKAGING

CROSS-REFERENCE TO RELATED APPLICATION

This application is a divisional of application Ser. No. 09/525,180, filed Mar. 14, 2000, abandoned.

BACKGROUND OF THE INVENTION

1. Field of the Invention

The present invention relates generally to a method and apparatus for permanently disabling an integrated circuit ("IC") input/output ("I/O") terminal after packaging. More particularly, the present invention relates to placing a disabling device, such as a fuse, between the output driver and the I/O terminal. As a final step in a test process, once all known good I/Os have been determined, the disabling device can be activated to permanently disconnect the I/O terminal from the IC.

2. State of the Art

Before integrated circuits ("IC") are placed into ordinary operation, they are packaged and tested to determine which I/O terminals function as they were designed to function. The terminals may be in the form of pins, pads, balls or pillars of an array or other conventional configurations. The I/O terminals which do function reliably are called known good I/Os. Based upon the pattern of known good I/Os for a given type of packaged IC, the ICs are sorted, or "binned," until they are placed onto printed circuit boards for use, often in combination to simulate an entirely functional IC.

The use of unreliable, or known bad, I/Os of an IC produces incorrect or faulty data, or incorrect processing of received data which can cause problems in the operation of a system. To avoid this problem, particularly when fabricating memory modules, a different pattern of printed circuit board trace ends or pads is used for each pattern or combination of known good I/Os. The pattern of trace pads is designed so that no traces contact a known bad I/O. Thus, for each pattern of known good I/Os, design and fabrication of a new printed circuit board trace and trace pad pattern are required. Although this solution of using a variety of printed circuit board designs is effective, it adds cost to the fabrication process and requires excessive printed circuit board inventory. Therefore, it is desirable to avoid the requirement of using different printed circuit board trace patterns for each different pattern of known good I/Os.

BRIEF SUMMARY OF THE INVENTION

The present invention relates to placing a disabling device or disconnect element between an output driver and an input/output terminal of an integrated circuit to enable permanent disconnection of the input/output terminal after packaging. The disabling device may comprise a device such as a fuse or an antifuse formed or otherwise carried on a semiconductor substrate.

In one embodiment, a dynamic random access memory ("DRAM") is disclosed having a plurality of known good input/output ("I/O") terminals and at least one known bad I/O terminal. Each known bad I/O terminal is disconnected as a final step in the test process by activating the disabling device through an external stimulus. Two or more DRAMs having complementary known good I/O terminal patterns may then be coupled in parallel on a carrier substrate such as a printed circuit board having conductive traces which extend to both the known good and the known bad I/O terminals. Multiple sets of two or more DRAMs may be placed on the same DRAM module, each set simulating a single whole DRAM. By using the disconnect element of the invention, a common module design may be used for all patterns of known good I/O terminals.

BRIEF DESCRIPTION OF THE SEVERAL VIEWS OF THE DRAWINGS

The nature of the present invention as well as other embodiments of the present invention may be more clearly understood by reference to the following detailed description of the invention to the appended claims, and to several drawings herein, wherein:

DETAILED DESCRIPTION OF THE INVENTION

Figure 1:
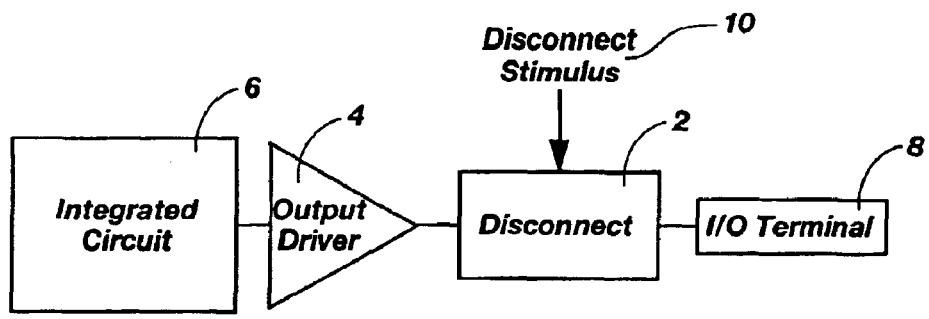
FIG. 1 is a block diagram of the electrical connection between an integrated circuit and an I/O terminal according to an embodiment of the invention.

FIG. 1 is a block diagram of the electrical connection between an integrated circuit ("IC") and its input/output ("I/O") terminal according to an embodiment of the invention. A disconnect element 2, also called a disabling device 2, is placed between the output driver 4 of the IC 6 and the IC I/O terminal 8. The disconnect element 2 may be a fuse or an antifuse because fuses and antifuses are the easiest disconnect element 2 to fabricate and initiate. Electrically initiated or activated fuses and antifuses, and methods of fabricating them, are well known in the art. However, alternatively, the disconnect element 2 may be any element which may be disabled by some disconnect stimulus 10, such as a laser blown fuse, or any element which could bypass the I/O terminal 8, such as a switching circuit which could bypass the I/O terminal 8 to ground when activated to disable the I/O terminal 8. There is a wide range of disconnect elements known in the art.

Figure 2:
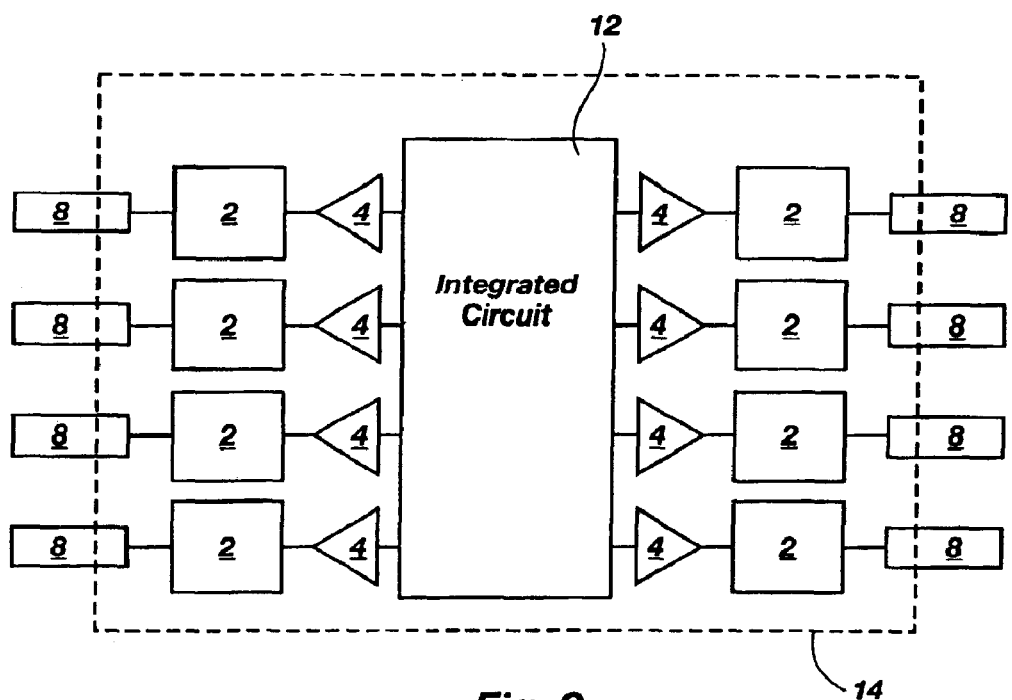
FIG. 2 is a block diagram of the internals of an integrated circuit package according to an embodiment of the invention.

FIG. 2 illustrates an embodiment of the invention comprising an IC 12 within a package 14. According to this embodiment, each I/O contact or I/O terminal 8 of the IC 12 is coupled through its own disconnect element 2 to the output driver 4 for that I/O terminal 8. Forming the disconnect element 2 on a semiconductor substrate with the IC 12 and the output driver 4 is currently most preferable because it adds negligible extra cost to the fabrication of the chip.

The only modification to a conventional IC configuration required for the IC 12 design is to change the mask configuration used to define an uppermost layer of metallization coupled to each I/O terminal 8, such as a bond pad, to include a disconnect element 2 attached to each I/O terminal 8, preferably between each I/O driver 4 and its associated I/O terminal 8. As will be clear to one of ordinary skill in the art, each disconnect element 2 may alternatively be formed into a conductive trace carried on a dielectric layer carried on the active surface of the IC 12, as part of printed circuit board traces or as part of a lead finger of a lead frame.

Figure 3:
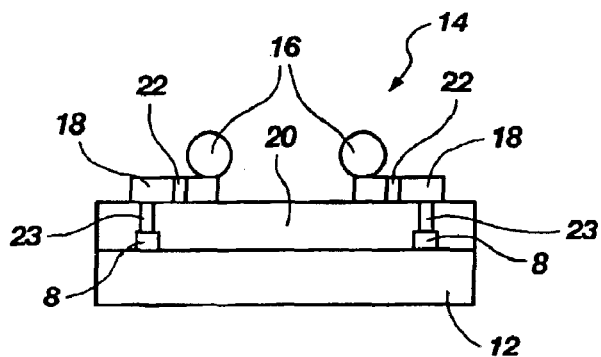
FIG. 3 is a cross-sectional diagram of a BGA array according to an embodiment of the invention.

FIG. 3 schematically illustrates another embodiment of the invention comprising a ball grid array ("BGA") package 14 having ball terminals 16 at the ends of traces 18 on the surface of the dielectric layer 20. Traces 18 are in communication with an I/O terminal 8, such as a bond pad, through a conductor-filled via 23. Each trace 18 in contact with a ball terminal 16 also includes a disconnect element 22 to enable disconnection of the I/O terminal. Of course, traces 18 would also usually be covered with a dielectric, or an insulative underfill would be disposed between IC 12 and its carrier substrate (not shown). The embodiment of FIG. 3 may be fabricated using traces 18 including disconnect elements 22 formed on dielectric layer 20, such as a polyimide film, the film then being laminated to the active surface of the die. This could be effectuated at the wafer level, so that the ICs 12 received from a vendor might be provided with the present invention during packaging thereof in a so-called "chip scale package," or CSP.

In reference to FIG. 1, to disconnect the I/O terminal 8 from the IC 6, some disconnect stimulus 10 is applied to the disconnect element 2. The particular disconnect stimulus 10 used will depend primarily upon the particular disconnect element 2 used and may certainly be applied directly to the disconnect element 2. Examples of disconnect stimulus 10 include over-current, over-voltage and switching commands. The disconnect stimulus 10 may be applied through the I/O terminal 8 as a step in the testing process. After it is determined that a particular I/O terminal 8 is not a known good I/O terminal, a disconnect stimulus can be immediately applied as part of the testing process. In this way, little or no additional cost is added to fabricating the ICs because no additional handling steps are required. The testing software program need only be altered to include a function which stimulates the disconnect element 2 if the I/O terminal 8 is not a known good I/O terminal.

Once the I/O terminals of an IC have been tested and it has been determined which of the I/O terminals are known good terminals, the IC is sorted and placed in a bin with other ICs having the same pattern of known good terminals, or otherwise marked as having a particular pattern of known good terminals. For example, if only I/O terminals 1–4 are known good, the remaining I/O terminals 5–8 being disconnected from the output drivers for those I/O terminals, the package will be placed in a bin with other similar packages which have I/O terminals 1–4 as known good terminals and I/O terminals 5–8 disconnected.

Taken from the appropriate bin or bins by identification from the marking, the ICs may be placed onto a printed circuit board for use in a particular application. Because the nonfunctional or known bad I/O terminals of the IC have been disconnected from the respective output drivers of the IC, it is not necessary to choose a carrier substrate such as a printed circuit board with traces specially designed to avoid contact with the known bad I/O terminals. Traces of a printed circuit board may contact each of the I/O terminals, both the known good and the known bad terminals. In this way, the cost of fabricating and organizing different printed circuit board designs for different patterns of known good terminals is avoided. A single printed circuit board design may thus be used regardless of the known good terminal pattern.

Depending upon the purpose of the IC and the particular application, software can be used to program which of the known good terminals are associated with which traces. For example, where a single partial DRAM has enough DRAM for a particular application, the known bad I/O terminals may be disconnected from their output drivers and, regardless of the known good I/O terminal pattern, the packaged DRAM may be placed in a socket in which all of the I/O terminals are being contacted. Software can be used to identify which I/O terminals are still connected to output drivers and use the DRAM available from those I/O terminals. Alternatively, multiple partially good ICs having complementary known good terminal patterns can be used in parallel to simulate a whole good IC of a given memory capacity. Use of software programming to identify and connect traces to a particular function are well known in the art. Of particular benefit with using the disconnect element as disclosed herein is the ability to use a single printed circuit board trace pattern regardless of the known good I/O terminal pattern.

Figure 4:
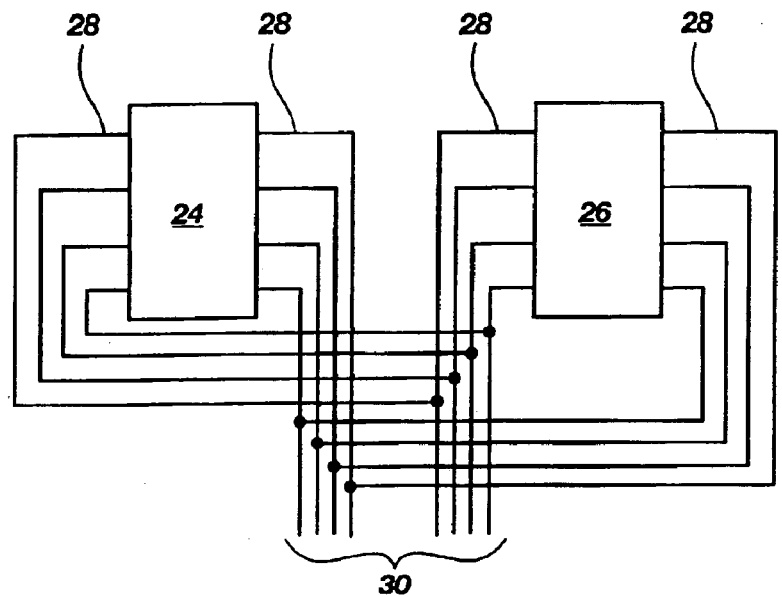
FIG. 4 is a block diagram of two DRAM chips connected in parallel according to an embodiment of the invention.

FIG. 4 illustrates an embodiment of the invention wherein two partial memory chips 24 and 26 are placed in parallel to simulate a single, wholly functional memory chip. Corresponding I/O terminals 28 of two partially good memory chips 24 and 26 are coupled to common external paths 30 to be electrically connected to an electronic system (not shown). The known good I/O terminal patterns of the two partially good memory chips 24 and 26 may be complementary so that only one known good I/O terminal is connected to any one external path 30. In other words, if I/O terminals 1–4 on the first partially good memory chip 24 are known good, the others being disconnected, chip 24 will be matched with chip 26 which has I/O terminals 5–8 which are known good, I/O terminals 1–4 being disconnected. In this way, only one known good I/O terminal is connected to each external path 30. By matching complementary partially good memory chips in this way, only one printed circuit board trace pattern is required for any pattern of known good I/O terminals. Alternatively, I/O terminals 1, 3, 5 and 6 on the first chip 24 and I/O terminals 2, 4, 7 and 8 on the second chip 26 could be known good terminals used to simulate a single, wholly functional chip. Similarly, I/O terminals 1–7 on the first chip 24 and I/O terminal 8 on the second chip 26 could be known good terminals used to simulate a single, wholly functional chip. As should be clear to one of ordinary skill in the art, any complementary pattern of known good I/O terminals is sufficient for this embodiment of the invention.

Figure 5:
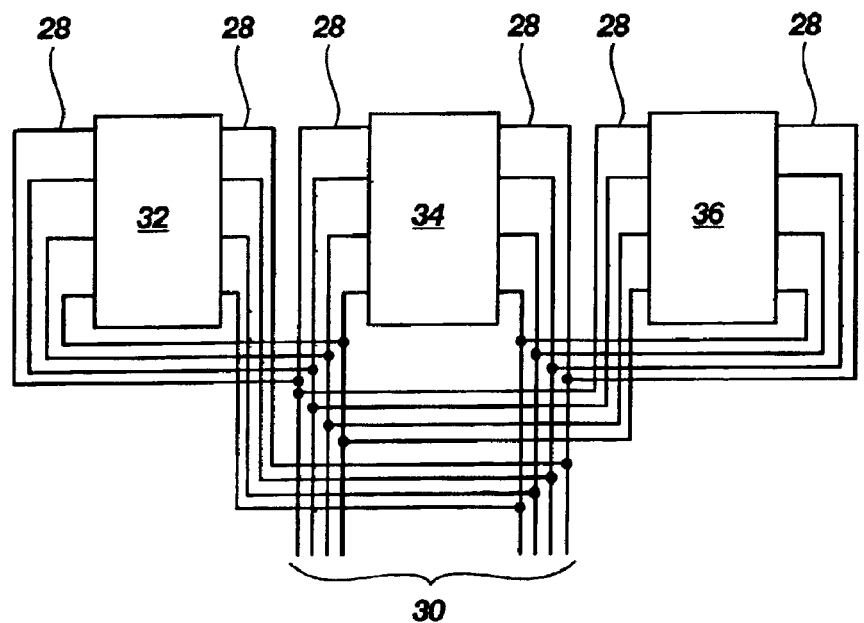
FIG. 5 is a block diagram of three DRAM chips connected in parallel according to an embodiment of the invention.

In a third embodiment of the invention, shown in FIG. 5, three partially good memory chips 32, 34 and 36, such as partial DRAMs, are used in combination to simulate a single, completely functional chip. Like the partially good memory chips chosen for the embodiment shown in FIG. 4, the partially good memory chips chosen for the present embodiment have complementary known good I/O terminal patterns such that only one known good I/O terminal is connected to any external path 30. For example, the first partially good memory chip 32 could have I/O terminals 1, 2 and 4 as known good terminals, the second partially good memory chip 34 could have I/O terminals 5, 6 and 8 as known good terminals, and the third partially good memory chip 36 could have I/O terminals 3 and 7 as known good terminals. It will be clear to one of ordinary skill in the art that the present invention is not limited to using just two or three partially good memory chips to simulate a wholly functional memory chip. One may use a number of partially good memory chips up to the number of known good I/O terminals required. However, for practical reasons, it is sometimes preferable to use only two, or at most three, partially good memory chips to simulate a wholly functional memory chip.

Figure 6:
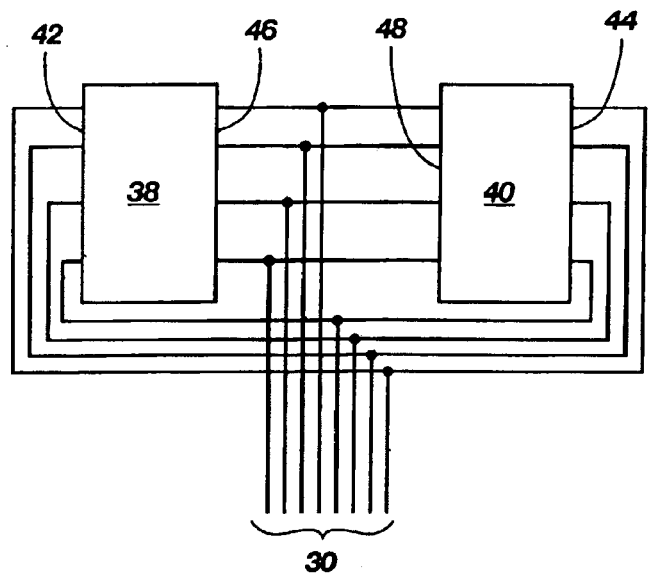
FIG. 6 is a block diagram of two DRAM chips connected according to an embodiment of the invention.

While the previous embodiments have illustrated use of multiple memory chips having overall complementary I/O terminal patterns to simulate a wholly functional memory chip, it will be clear to one of ordinary skill in the art that this is not required. Depending on the pattern which a designer chooses to follow, a common printed circuit board trace design may be fabricated to accommodate the present invention using any number of I/O patterns. For example, as shown in FIG. 6, if a designer chooses, the complementary nature of the I/O matches may be divided by side of the memory chip rather than by the overall chip pattern. FIG. 6 shows a complementary pattern scheme where the I/O terminals of a first side 42 of a first memory chip 38 and the I/O terminals of a second side 44 of a second memory chip 40 are each respectively connected to common external paths 30. The I/O terminals of a second side 46 of the first memory chip 38 and the I/O terminals of a first side 48 of the second memory chip 40 are similarly each respectively connected to common external paths 30. An external path, as used herein, refers to a path intended to connect to a system external to the immediate system. For example, an immediate system may be a memory module or even a single memory chip, which communicates with an external system such as a memory system, which includes a memory controller and possibly other memory modules or chips, through external paths such as conductive traces between the memory controller and the known good I/O terminals. In this way, two memory chips which each have other than an overall complementary known good I/O terminal pattern, but which still have a partially complementary known good I/O terminal pattern, such as both having all I/O terminals on the same side known good, can be used with the same printed circuit board trace pattern. As with the embodiments shown in FIGS. 4 and 5, the only requirement for this embodiment is that at least one known good I/O terminal be attached to each external path 30 to simulate a single, wholly functional memory chip. To the software and other external hardware, this combination of partially good memory chips will respond like a wholly functional memory chip.

The previous embodiments have all shown memory chips having only eight I/O terminals per chip. Memory chips having only eight I/O terminals were used to simplify the drawings and explanation of the nature of the invention. It will be clear to one of ordinary skill in the art that application of the present invention is not limited to memory chips with only eight I/O terminals, but can easily be applied to chips having any number of terminals.

Figure 7A:
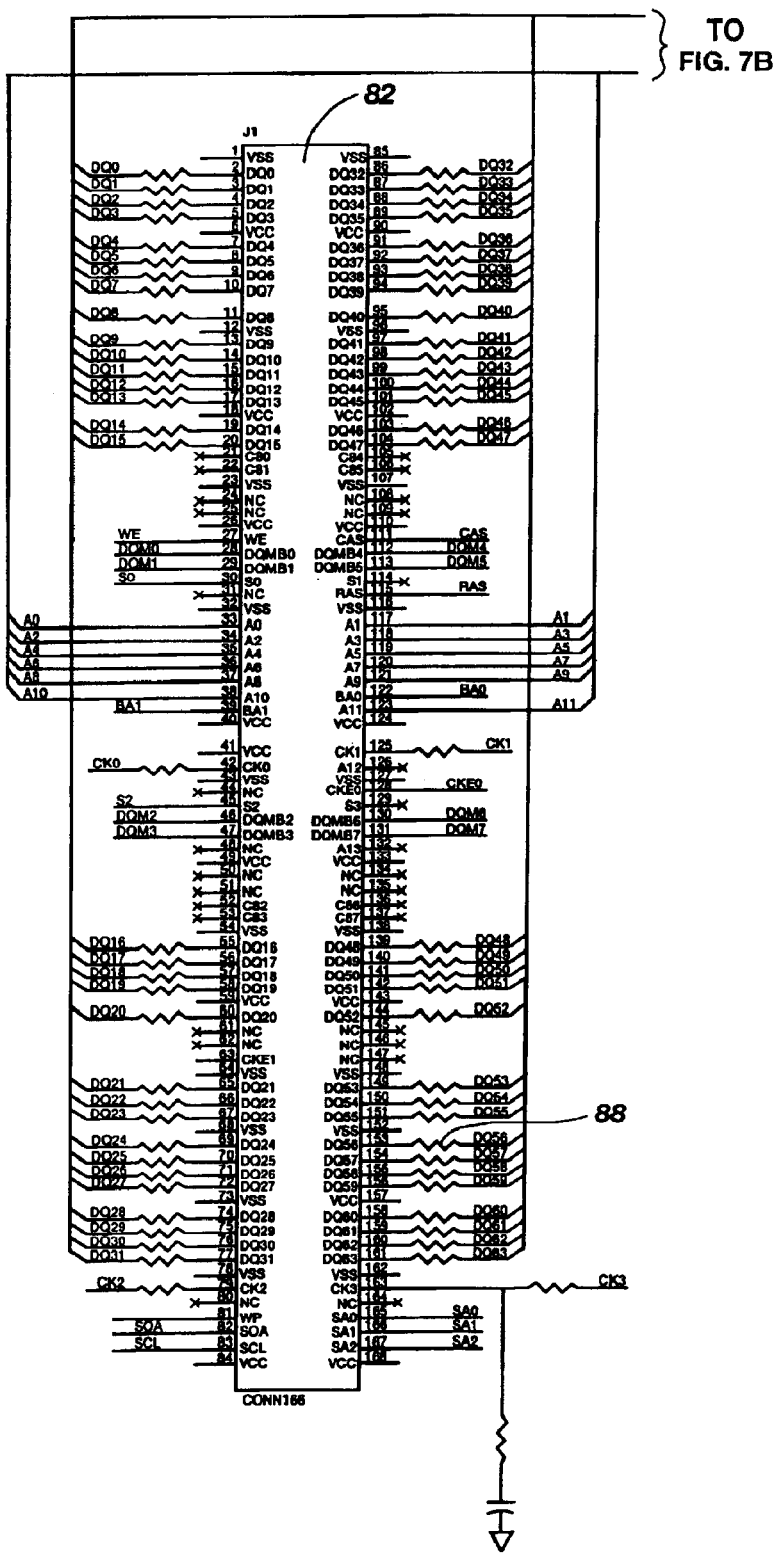
FIGS. 7A–7C are schematic diagrams of a multi-chip DRAM module according to an embodiment of the invention.
Figure 7B:
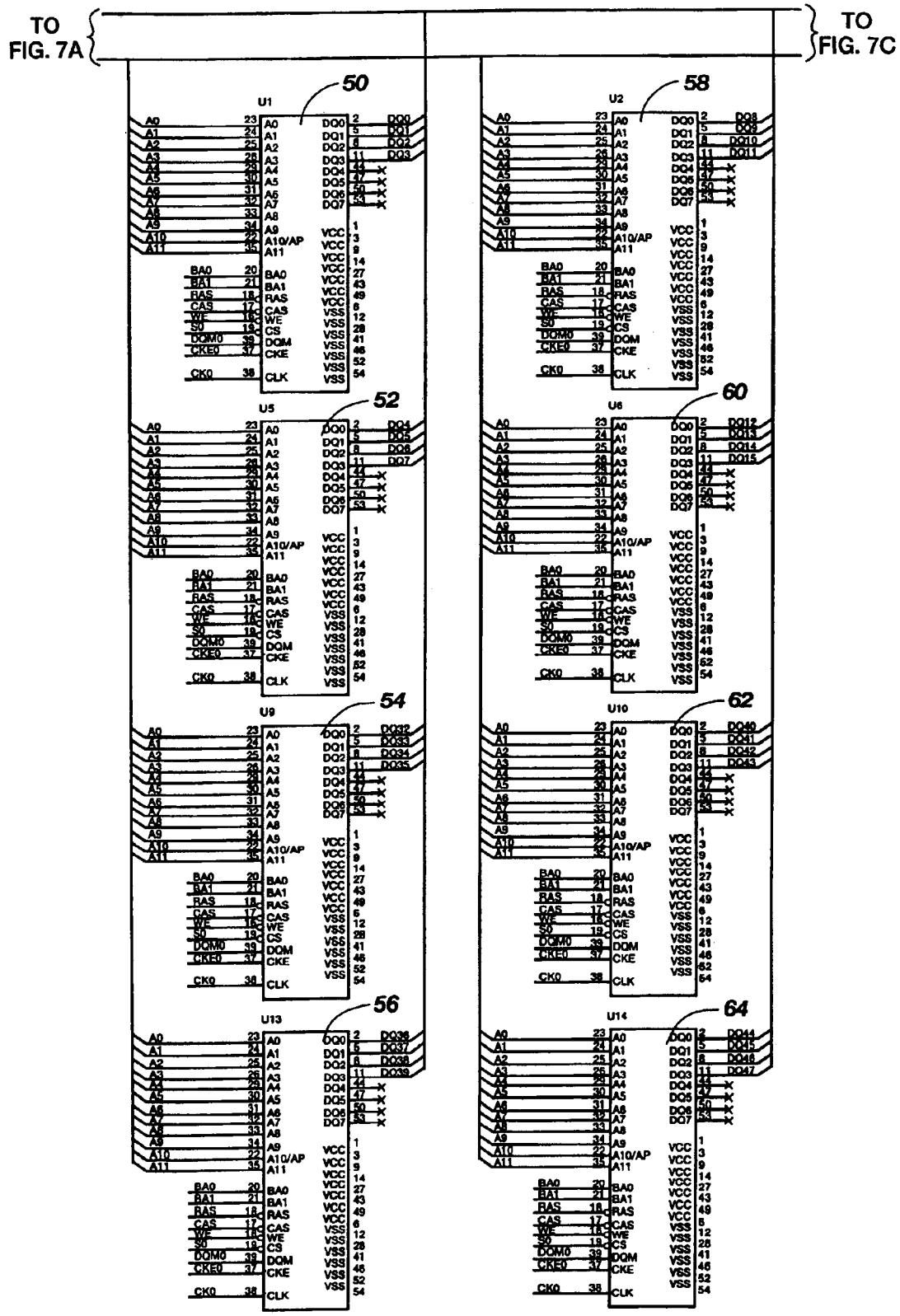
Figure 7C:
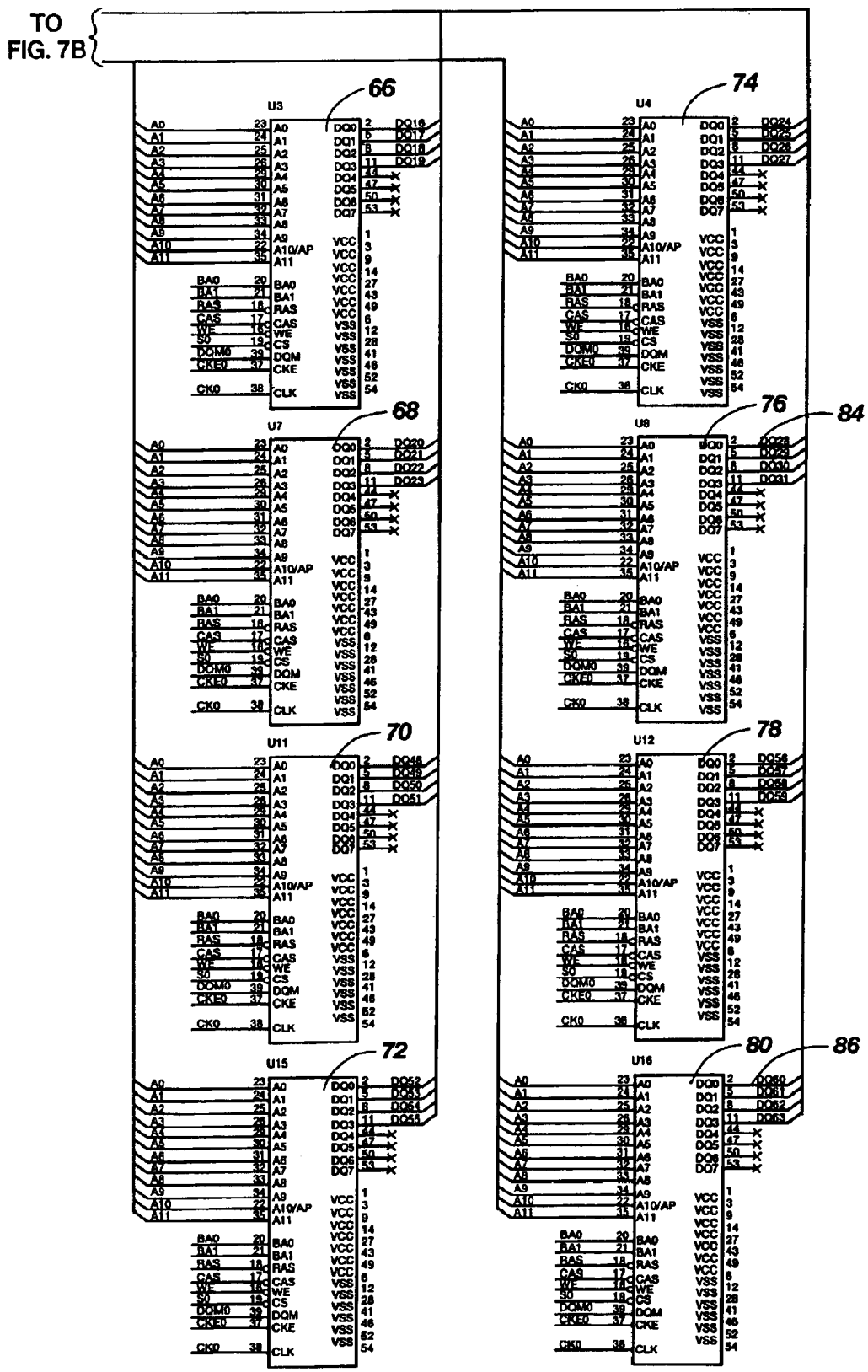

By simple example, FIGS. 7A–7C are schematic diagrams of an embodiment of a 64-Megabyte memory module using sixteen partial DRAMs 50, 52, 54, 56, 58, 60, 62, 64, 66, 68, 70, 72, 74, 76, 78 and 80, each having their data I/O terminals coupled to a disconnect element (not shown) within each partial DRAM package. As discussed previously, using a printed circuit board trace pattern which allows complementary I/O terminals to be connected to common external paths, which are then connected to an external circuit, permits a single printed circuit board trace pattern to be used for every pattern of known good I/O terminals for a given overall I/O terminal pattern. The "X"s placed on the data I/O terminal lines indicate those I/O terminals which are coupled to a disconnect element which has been disconnected. Note that for the example shown, though there are two complementary data terminals coupled to each data terminal of the memory controller 82, one of those two is a known good I/O terminal and the other of the two is connected to a disconnect element which has been disconnected. For example, both the first data I/O terminal 84 on the eighth partial DRAM 76 and the first data I/O terminal 86 on the sixteenth partial DRAM 80 are connected to DQ 56 88 of the memory controller 82. As noted by the "X" on the first data I/O terminal 86 on the sixteenth partial DRAM 80, that I/O terminal was not determined to be a known good I/O terminal and the disconnect element (not shown) corresponding to that I/O terminal 86 was stimulated, preferably during testing.

Figure 8:
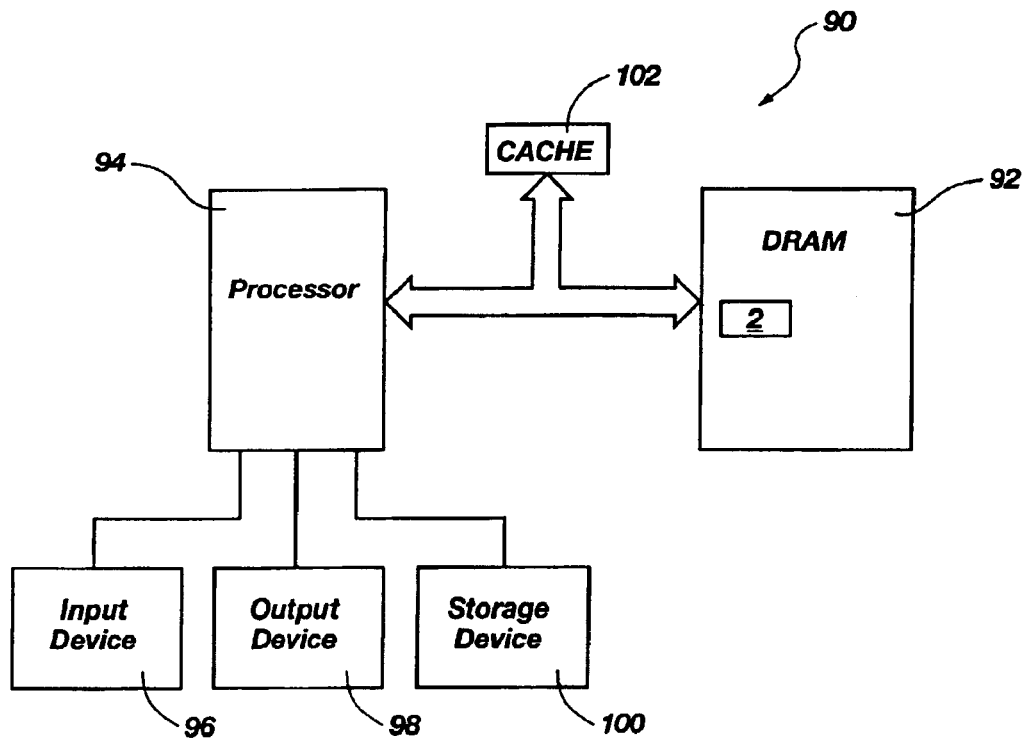
FIG. 8 is a block diagram of an electronic system including a DRAM according to the present invention.

FIG. 8 is a block diagram of an electronic system 90 which includes DRAM 92 comprising I/O terminals coupled to a disconnect element 2 as shown in FIG. 1. The electronic system 90 includes a processor 94 for performing various computing functions, such as executing specific software to perform specific calculations or tasks. Additionally, the electronic system 90 includes one or more input devices 96, such as a keyboard or a mouse, coupled to the processor 94 to allow an operator to interface with the electronic system 90. Typically, the electronic system 90 also includes one or more output devices 98 coupled to the processor 94, such output devices typically being a printer, a video terminal or a network connection. One or more data storage devices 100 are also typically coupled to the processor 94 to store data or retrieve data from external storage media (not shown). Examples of typical storage devices 100 include hard and floppy disks, tape cassettes, and compact disks. The processor 94 is also typically coupled to a cache memory 102, which is usually static random access memory ("SRAM"), and to the DRAM 92. It will be understood, however, that the disconnect element 2 may also be incorporated into any one of the input, output and processor devices 96, 98 and 94, and cache memory 102.

Figure 9:
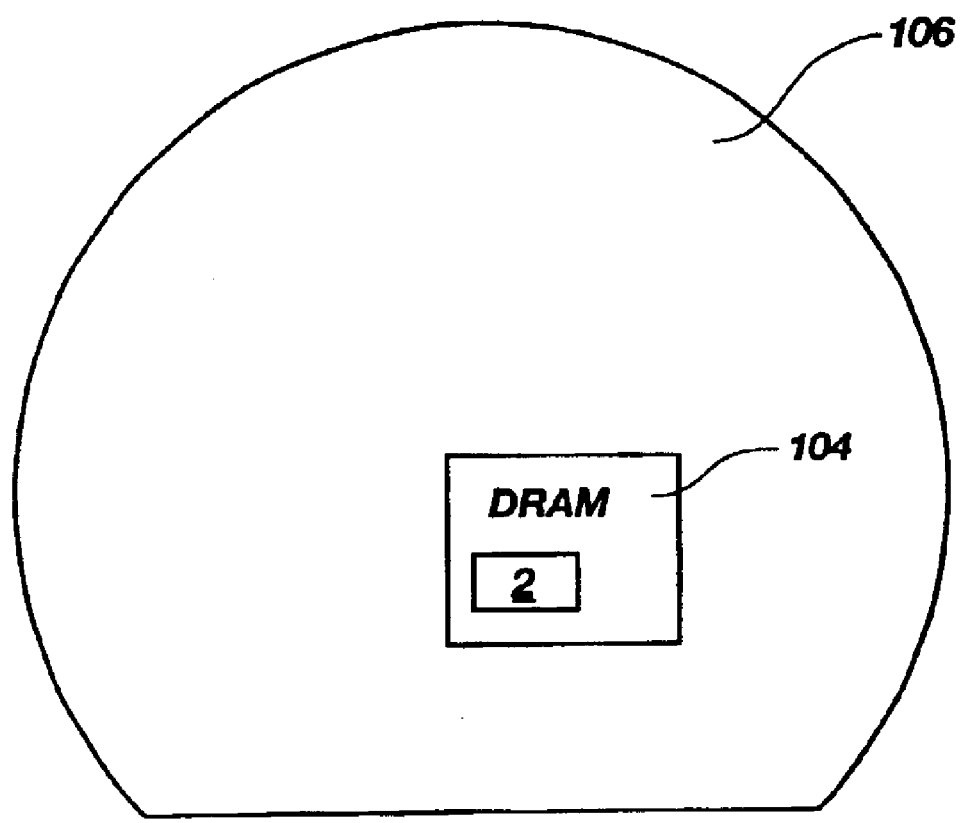
FIG. 9 is a block diagram of a semiconductor wafer having a DRAM thereon according to the present invention.

As shown in FIG. 9, a DRAM 104 using the disconnect element 2 of FIG. 1 is fabricated on the surface of a semiconductor wafer 106 of silicon, gallium arsenide, or indium phosphide in accordance with this invention. Of course, it should be understood that the DRAM 104 with a disconnect element 2 may be fabricated on semiconductor substrates other than a wafer, such as a Silicon-on-Insulator (SOI) substrate, a Silicon-on-Glass (SOG) substrate, a Silicon-on-Sapphire (SOS) substrate, or other semiconductor material layers on supporting substrates.

As will be clear to one of ordinary skill in the art, the disconnect element connected between the I/O terminal and output driver for a DRAM as shown and described herein is not limited to application in a DRAM. For example, there are many applications in which it is desirable to permanently disconnect an input or output of an IC after packaging to avoid communication with that input or output. One particular example of this is an IC having redundant inputs or outputs provided for varying circuit board trace layouts. Using the disconnect element of the present invention, the unneeded inputs or outputs can be permanently disabled.

Although the present invention has been shown and described with reference to particular embodiments, various additions, deletions and modifications that will be apparent to a person of ordinary skill in the art to which the invention pertains, even if not shown or specifically described herein, are deemed to lie within the scope of the invention as encompassed by the following claims.

What is claimed is:

1. A method of testing an integrated circuit, the method comprising:

testing a plurality of input/output terminals of the integrated circuit, each of the plurality of input/output terminals having a corresponding I/O driver coupled thereto;

determining whether each input/output terminal of the plurality of input/output terminals is a functional terminal; and initiating a permanent disconnect device coupled to each input/output terminal of the plurality not determined to be a functional terminal, the disconnect device configured to isolate each I/O driver from each input/output terminal not determined to be functional.

2. The method of claim 1, wherein said initiating a permanent disconnect device comprises blowing a fuse.

3. The method of claim 1, wherein said initiating a permanent disconnect device is performed as a final step in a testing process.

4. The method of claim 1, wherein said initiating a permanent disconnect device comprises switching a circuit to disable each of the plurality of input/output terminals by bypassing respective input/output terminals to ground.

5. The method of claim 1, wherein the integrated circuit is a memory device.

6. The method of claim 1, wherein testing comprises testing a plurality of input/output terminals of each of at least a first memory device and a second memory device.

* * * * *